United States Patent
Hsueh et al.

(10) Patent No.: US 8,319,532 B2
(45) Date of Patent: Nov. 27, 2012

(54) FREQUENCY DIVIDER WITH PHASE SELECTION FUNCTIONALITY

(75) Inventors: Yu-Li Hsueh, New Taipei (TW); Jing-Hong Conan Zhan, HsinChu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 81 days.

(21) Appl. No.: 13/097,050

(22) Filed: Apr. 28, 2011

(65) Prior Publication Data

US 2012/0126862 A1    May 24, 2012

Related U.S. Application Data

(60) Provisional application No. 61/415,168, filed on Nov. 18, 2010.

(51) Int. Cl.
*H03K 21/00* (2006.01)
(52) U.S. Cl. ............................ 327/115; 327/117; 377/48
(58) Field of Classification Search ................... 327/115, 327/117, 118; 377/47, 48
See application file for complete search history.

(56) References Cited

U.S. PATENT DOCUMENTS

| | | | | |
|---|---|---|---|---|
| 5,844,436 A | * | 12/1998 | Altmann | 327/156 |
| 6,249,189 B1 | * | 6/2001 | Wu et al. | 331/18 |
| 6,542,013 B1 | * | 4/2003 | Volk et al. | 327/115 |
| 6,671,341 B1 | * | 12/2003 | Kinget et al. | 375/373 |
| 6,686,784 B2 | * | 2/2004 | Chang | 327/157 |
| 6,760,398 B2 | * | 7/2004 | Casagrande | 377/47 |
| 6,956,793 B2 | * | 10/2005 | Ngo | 368/156 |
| 7,012,985 B1 | * | 3/2006 | Nix | 377/48 |
| 7,116,747 B2 | * | 10/2006 | Casagrande | 377/47 |
| 7,187,216 B2 | * | 3/2007 | Sun et al. | 327/115 |
| 7,639,053 B2 | * | 12/2009 | Shen et al. | 327/158 |
| 7,741,886 B2 | * | 6/2010 | Tsai | 327/117 |
| 7,777,534 B2 | * | 8/2010 | Kuan | 327/117 |
| 7,778,371 B2 | * | 8/2010 | Do et al. | 375/371 |
| 7,813,466 B2 | * | 10/2010 | Huang et al. | 377/47 |
| 7,969,209 B2 | * | 6/2011 | Badillo | 327/115 |
| 2005/0110581 A1 | * | 5/2005 | Ngo | 331/18 |
| 2006/0071717 A1 | * | 4/2006 | El-Kacimi et al. | 331/16 |
| 2009/0002080 A1 | * | 1/2009 | Kim | 331/18 |
| 2010/0225361 A1 | * | 9/2010 | Rhee et al. | 327/105 |

* cited by examiner

*Primary Examiner* — Lincoln Donovan
*Assistant Examiner* — William Hernandez
(74) *Attorney, Agent, or Firm* — Winston Hsu; Scott Margo

(57) ABSTRACT

A frequency divider comprises a phase selector and a timing circuit. The phase selector is arranged to receive a plurality of input signals and a plurality of control signals and output a plurality of output signals according to the control signals, wherein a predetermined reference voltage and the input signals are selectively chosen to generate the output signals according to the control signals, and the input signals are of a same frequency but different phases. The timing circuit is arranged to receive the output signals and generate the control signals according to the output signals.

16 Claims, 8 Drawing Sheets

FREQUENCY DIVIDER WITH PHASE SELECTION FUNCTIONALITY

CROSS REFERENCE TO RELATED APPLICATIONS

This application claims the benefit of U.S. Provisional Application No. 61/415,168, filed on Nov. 18, 2010 and included herein by reference.

BACKGROUND OF THE INVENTION

1. Field of the Invention

The present invention relates to a frequency divider, and more particularly, to a fractional frequency divider with phase selection functionality.

2. Description of the Prior Art

Clock generating systems such as phase locked loops and delay locked loops have a variety of applications in wireless communication systems. In order to minimize interference between crucial components within a system-on-chip (SOC), signals with large power should be well-defined and separated from each other in the frequency domain to obtain a better performance. As a result, fractional frequency dividers are significant building blocks within a wireless transmitter or receiver.

Conventional frequency dividers in low frequency range are usually implemented with dual-modulus or multi-modulus prescalers; for example, a divide-by-4.5 circuit can be realized by a prescaler with its modulus equally distributed between 4 and 5. Since these prescalers are required to change their modulus during simultaneous outputting of divided signals, noise generated from modulus transition may degrade the outcome of the prescaler, leading to undesired jitter.

In addition, dual-modulus or multi-modulus prescalers work in a digital fashion and are not suitable for operation at high frequency. Some conventional high-speed frequency dividers utilize a self-mixing mechanism to overcome the speed issue. Unfortunately, this is at the expense of inductor area, wherein inductors are necessary to filter out a desired signal amongst mixed results. Therefore, circuit designers still seek a more elegant solution to derive a frequency dividing topology with less jitter noise and more efficiency.

SUMMARY OF THE INVENTION

According to a first aspect of the present invention, a frequency divider is disclosed. The frequency divider comprises a phase selector and a timing circuit. The phase selector is arranged to receive a plurality of input signals and a plurality of control signals and output a plurality of output signals according to the control signals, wherein a predetermined reference voltage and the input signals are selectively chosen to generate the output signals according to the control signals, and the input signals are of a same frequency but different phases. The timing circuit is arranged to receive the output signals and generate the control signals according to the output signals.

According to a second aspect of the present invention, a frequency divider is disclosed. The frequency divider comprises a phase selector and a timing circuit. The phase selector is arranged to receive a plurality of input signals and a plurality of control signals and output a plurality of output signals according to the control signals, wherein a predetermined reference voltage and the input signals are selectively chosen to generate the output signals according to the control signals, and the input signals are of a same frequency but different phases. The timing circuit is arranged to receive the input signals and generate the control signals according to the input signals.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
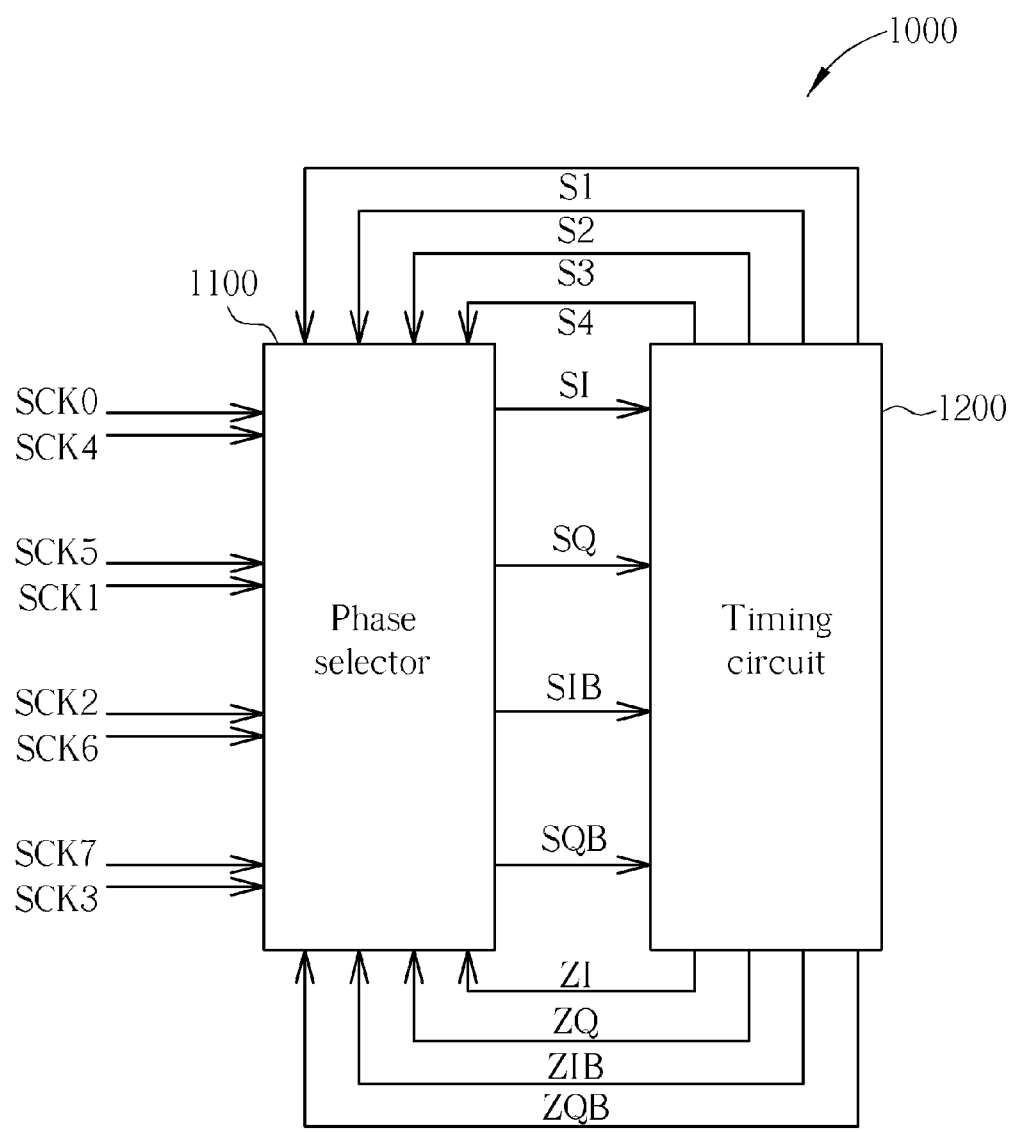
FIG. 1 is a diagram of a frequency divider according to an embodiment of the present invention.

Please refer to FIG. 1, which is a diagram of a frequency divider 1000 according to an embodiment of the present invention. The frequency divider 1000 includes (but is not limited to) a phase selector 1100 and a timing circuit 1200. The phase selector 1100 is arranged to receive a plurality of input signals and a plurality of control signals and output a plurality of output signals according to the control signals. A predetermined reference voltage and the input signals are selectively chosen to generate the output signals according to the control signals, the input signals are of a same frequency but different phase, and each of the output signals has a waveform partially generated from one of the input signals and partially generated from the predetermined reference voltage. The timing circuit 1200 is arranged to receive the output signals and generate the control signals according to the output signals. With a proper selection of the control signals, the frequency divider 1000 is capable of combining the input signals of different phases into frequency-divided signals with desired dividing ratio (integer or fractional); with the help of the timing circuit 1200, the phase selector 1100 can successfully construct those output waveforms without any glitch.

Please note that, in this embodiment, the phase selector 1100 receives eight input signals SCK0~SCK7 which are equally split in phase, and outputs four divide-by-2.5 output signals SI, SQ, SIB and SQB with a duty cycle of 20%; however, this is not supposed to be a limitation to the present invention. In other embodiments of present invention, the frequency divider 1000 receiving three input signals or more is also capable of providing other frequency dividing ratios and other duty cycles (more or less than 20%) with a proper configuration of the timing circuit 1200.

Figure 2:
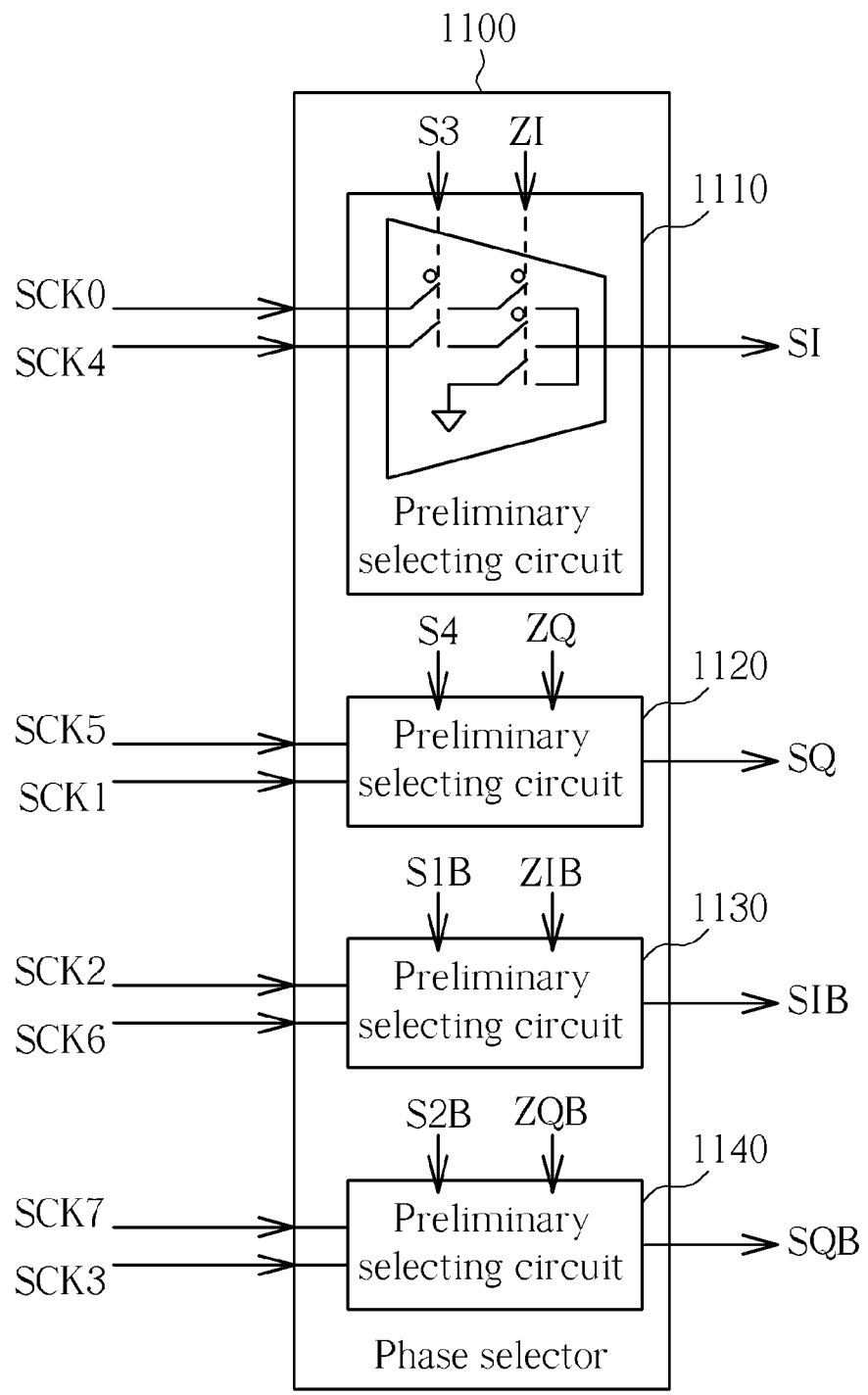
FIG. 2 is a structural diagram of a phase selector according to an embodiment of the present invention.

Please refer to FIG. 2 for structural details within the phase selector 1100. FIG. 2 is a structural diagram of the phase selector 1100 according to an embodiment of the present invention. The phase selector 1100 includes preliminary selecting circuits 1110~1140. In the example of FIG. 2, only the structural details of preliminary selecting circuits 1110 are illustrated, wherein each structure within preliminary selecting circuits 1120~1140 is identical to that of the preliminary selecting circuits 1110, and therefore further details are omitted for brevity. In this embodiment, the phase selector 1100 receives two categories of control signals generated from the timing circuit 1200: path control signals S1B, S2B, S3, S4 and output control signals ZI, ZQ, ZIB, ZQB. In FIG. 2, the phase selecting circuit 1110 is implemented with a multiplexer dominated by the path control signals S3 and the output control signal ZI to selectively output an input signal chosen from the input signals SCK0 and SCK4 or a predetermined reference voltage (a reference ground voltage GND in this example). First of all, the preliminary selecting circuits 1110 chooses a preliminary signal from the input signals SCK0 and SCK4 according to the path control signal S3, and then chooses between the chosen preliminary signal (the input signals SCK0 or SCK4) and the predetermined reference voltage to be the output signal SI according to the output control signal ZI.

Figure 3:
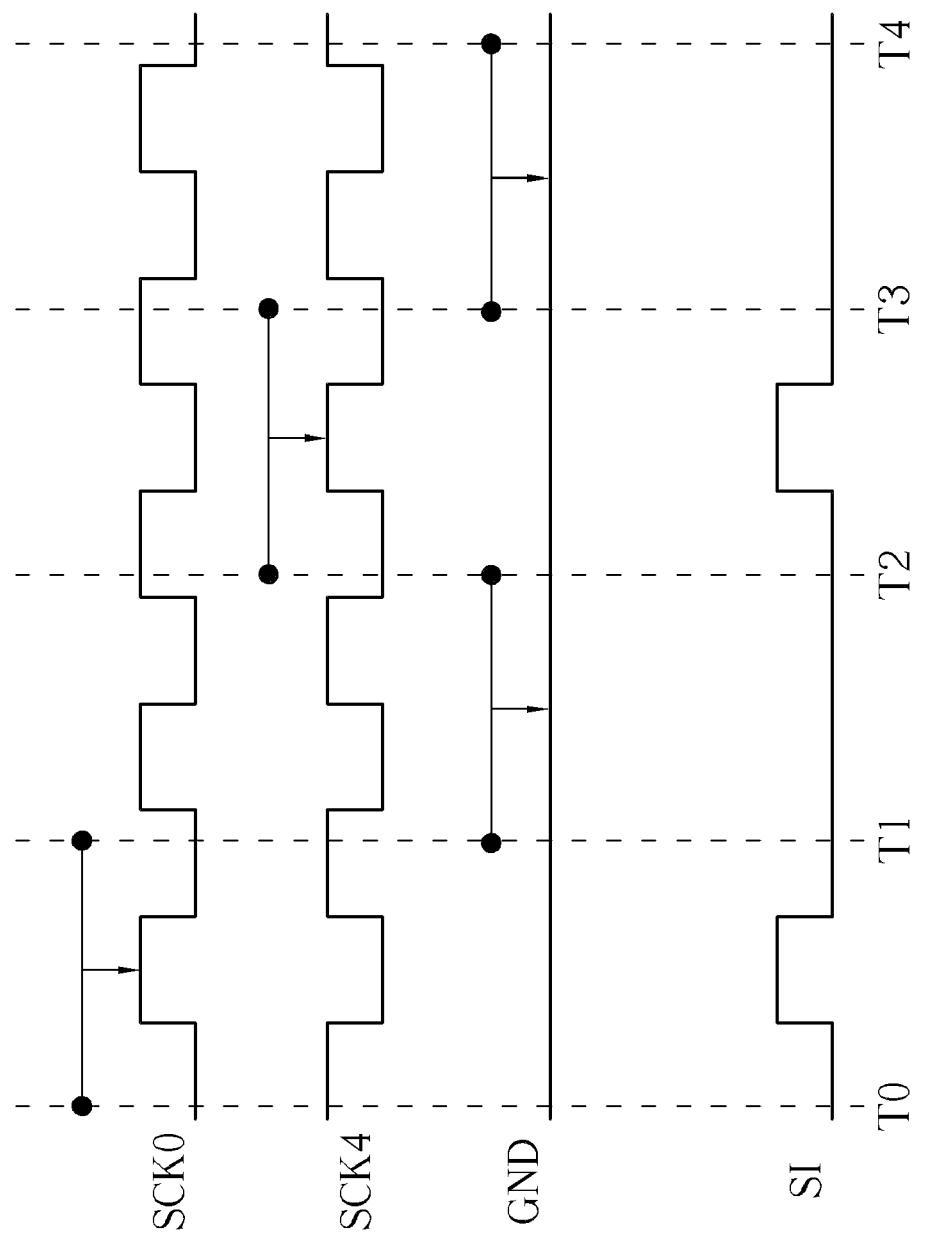
FIG. 3 is a timing diagram of partial signals within a preliminary selecting circuit according to an embodiment of the present invention.

Please refer to FIG. 3 for operation details of the preliminary selecting circuit 1110. FIG. 3 is a timing diagram of partial signals within the preliminary selecting circuit 1110 according to an embodiment of the present invention. At a beginning time point T0, the preliminary selecting circuit 1110 chooses to output a partial interval of the input signal SCK0 according to the path control signal S3 and the output control signal ZI; then at another time point T1, the output control signal ZI toggles and therefore the preliminary selecting circuit 1110 chooses to output the reference ground voltage GND instead of the input signals SCK0 or SCK4; at the next time point T2, the output control signal ZI toggles again and thus the preliminary selecting circuit 1110 chooses to output the preliminary signal, i.e., one of the input signals SCK0 and SCK4. Please note that during the time interval from T1 to T2, the path control signal S3 also toggles to switch the chosen preliminary signal from the input signal SCK0 to the input signal SCK4. Please note that, since the output control signal ZI is indicative of the reference ground voltage GND, the glitch resulting from the switching operation from the input signal SCK0 to the input signal SCK4 does not have any influence on the output signal SI at all; in other words, the utilization of the output control signal ZI and the reference ground voltage GND ensures a glitch-free signal phase transition (i.e., from the input signal SCK0 to the input signal SCK4) at the output signal SI. At time point T3, the output control signal ZI toggles such that the preliminary selecting circuit 1110 chooses to output the reference voltage GND again, and during the time interval from T3 to T4, the path control signal S3 also toggles to be indicative of the input signal SCK0 again. Therefore, at the next time point T4, the preliminary selecting circuit 1110 will choose a partial interval of the input signal SCK0 again.

Figure 4:
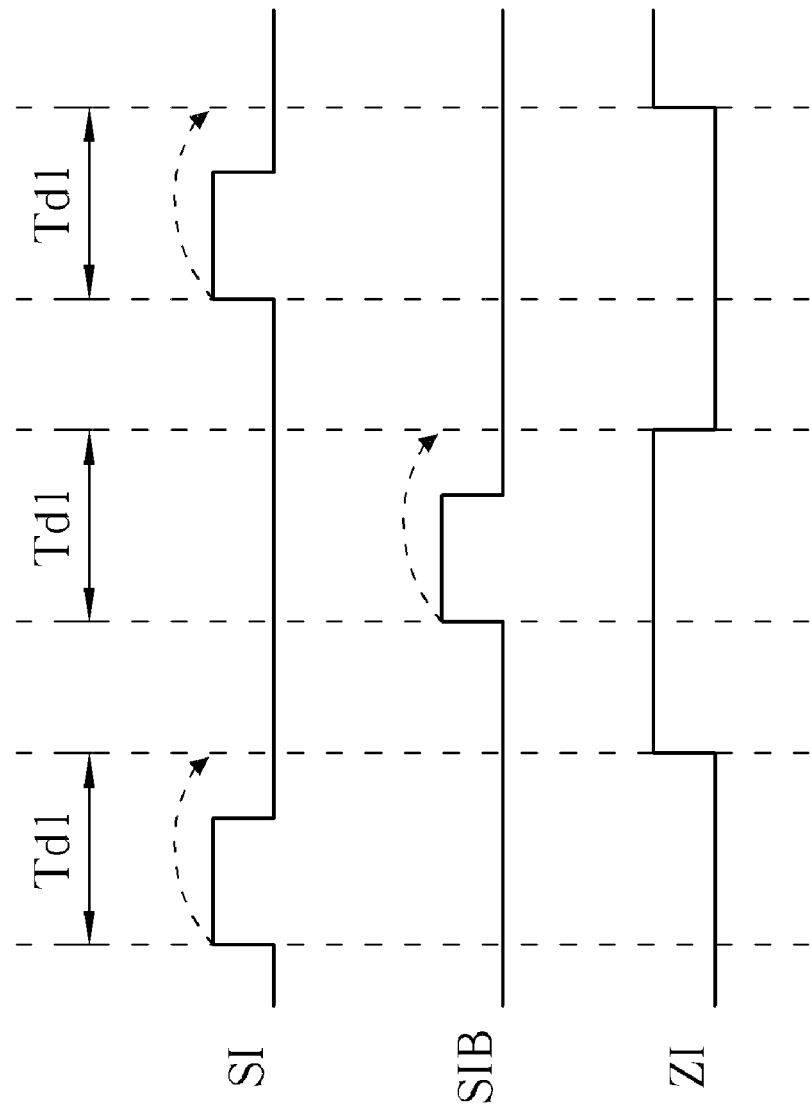
FIG. 4 is a timing diagram of two output signals and an output control signal according to an embodiment of the present invention.

Please refer to FIG. 4 for details of the generation of the output control signal ZI. FIG. 4 is a timing diagram of the output signals SI, SIB and the output control signal ZI according to an embodiment of the present invention. In this embodiment of the present invention, the output control signal ZI is toggled by rising edges of both the output signal SI and SIB, i.e., when a rising edge of either the output signal SI or SIB occurs, the output control signal ZI toggles after a predetermined delay time Td1, which is caused by a series of signal traveling times via multiple circuits. Please note that the delay time Td1 should be properly designed such that the output control signal ZI toggles only after a pulse of the output signal SI or SIB is completed. In other words, although the command of toggling is sent out at the rising edge of the output signal SI or SIB, the actual toggling operation should be designed to take place after the falling edge of the output signal SI or SIB such that a complete impulse of the input signal SCK0 or SCK4 can be chosen as the output signal SI. In addition, the output control signal ZI has a period identical to the period of the output signal SI or SIB but differs in phase and duty cycle, and therefore the preliminary selecting circuit 1110 can correctly perform a switching operation between the chosen preliminary signal (the input signal SCK0 or SCK4) and the reference ground voltage GND.

Figure 5:
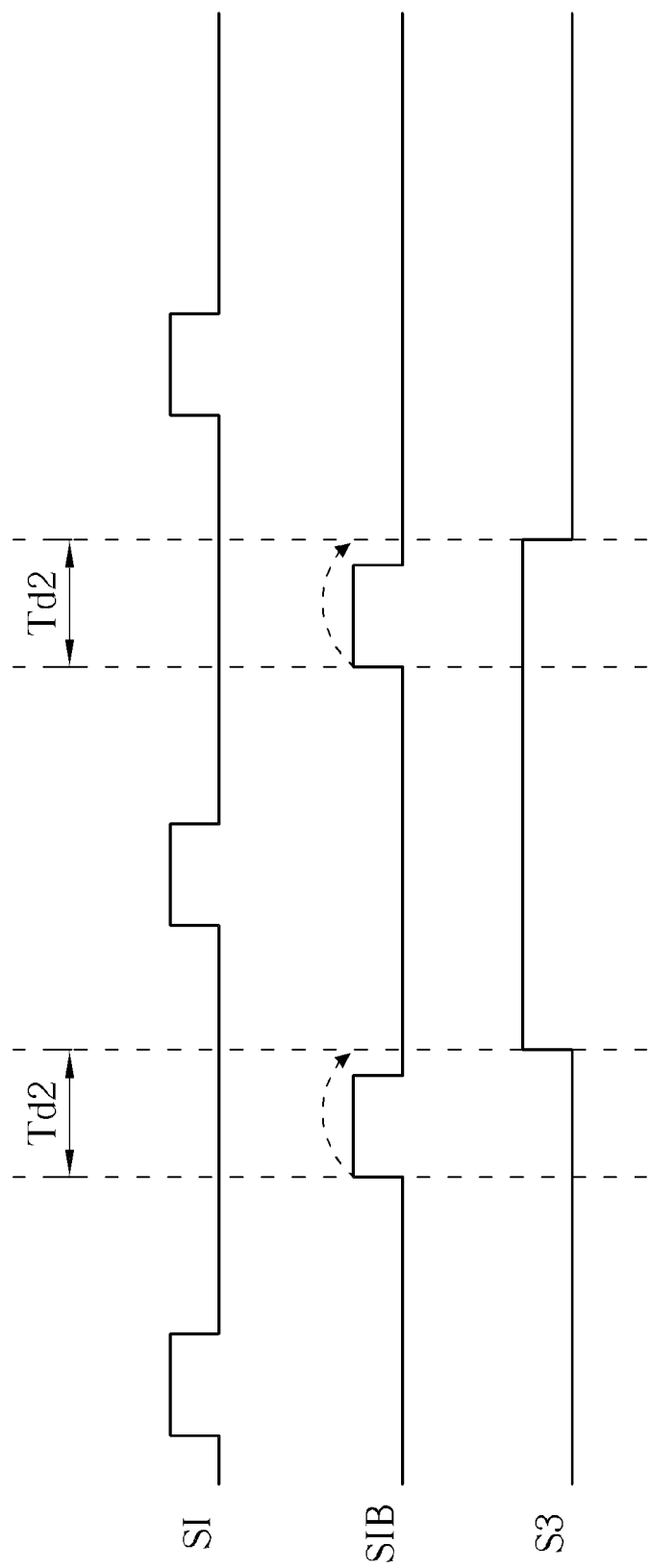
FIG. 5 is a timing diagram of two output signals and a path control signal according to an embodiment of the present invention.

Please refer to FIG. 5 for details of the generation of the path control signal S3. FIG. 5 is a timing diagram of the output signals SI, SIB and the path control signal S3 according to an embodiment of the present invention. In the example of FIG. 5, there is a phase difference of 180 degrees between the output signals SI and SIB, and the path control signal S3 is controlled according to the rising edge of the output signal SIB. When a rising edge of the output signal SIB occurs, the path control signal S3 toggles after a predetermined delay time Td2, which is caused by a series of signal traveling times via multiple circuits. In this embodiment, the timing requirement of Td2 is quite relaxed. As long as the clock switching occurs during the time interval when the preliminary selecting circuit outputs the reference voltage, the output waveform can be free from glitch. Please note that since the path control signal S3 toggles according to the rising edge of the output signal SIB, the path control signal S3 has a period which is twice a period of the output signal SIB, and in this way, the preliminary selecting circuit 1110 is capable of properly switching the preliminary signal between the input signal SCK0 and SCK4.

Although the aforementioned embodiments only illustrate the operation of the phase preliminary selecting circuits 1110, those skilled in this field can easily deduce the operation of the preliminary selecting circuits 1120~1140 based on the same concepts. Generally speaking, those frequency dividing circuits that utilize inherent outputs signals to generate control signals for selecting from a predetermined reference voltage and multiple input signals of identical waveform and different phase all fall within the scope of the present invention.

Figure 6:
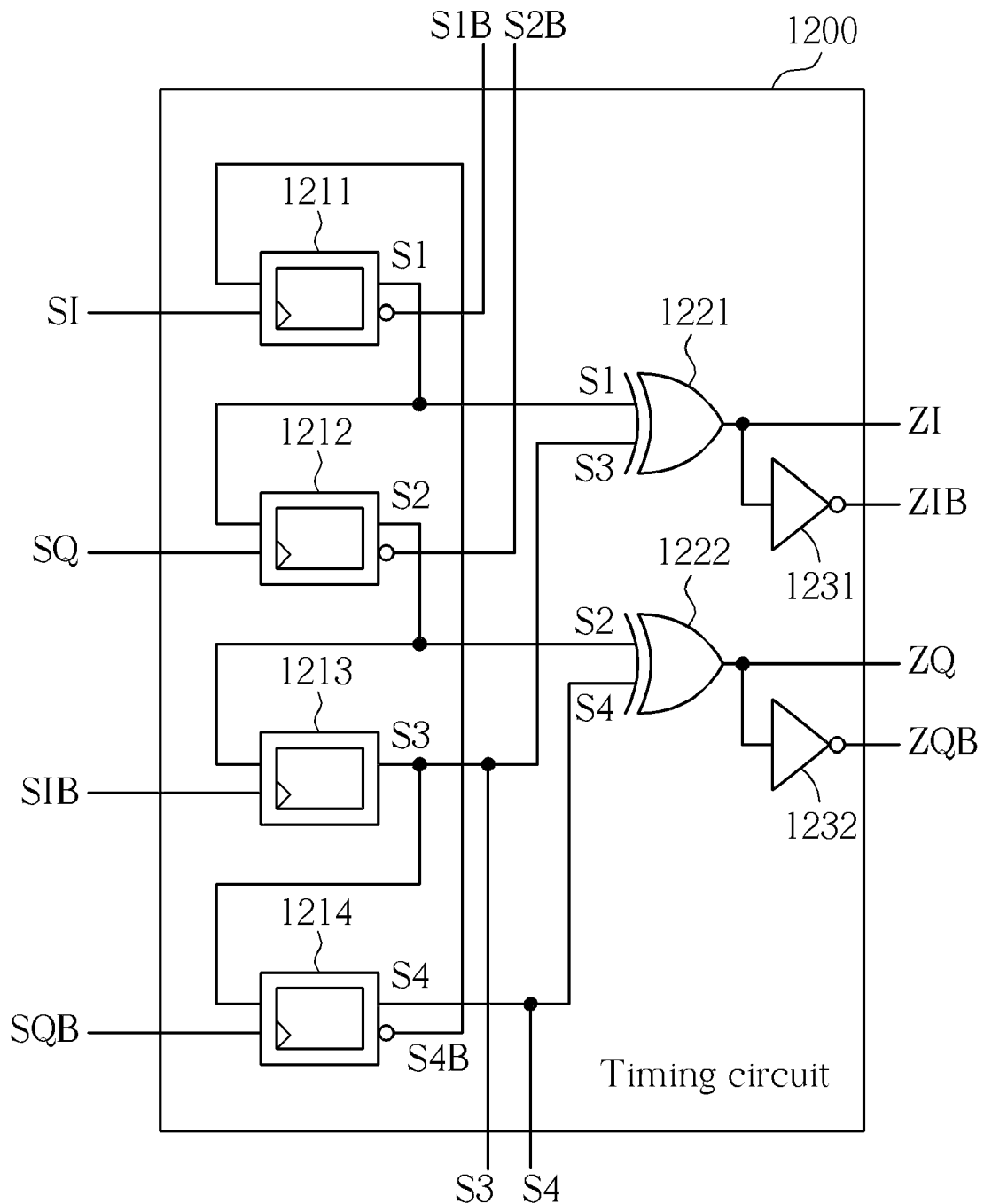
FIG. 6 is an exemplary circuit diagram of a timing circuit according to an embodiment of the present invention.

Please refer to FIG. 6, which is an exemplary circuit diagram of the timing circuit 1200 according to an embodiment of the present invention. The timing circuit 1200 includes (but is not limited to) four DFFs 1211~1214, two XOR gates 1221~1222 and two inverters 1231~1232. The DFFs 1211~1214 receive the output signals SI, SQ, SIB, SQB as clock signals, respectively, and are coupled to each other to generate the path control signals S1~S4, S1B, S2B and S4B coherently, wherein the path control signals S1B, S2B and S4B are, respectively, inverses of the path control signals S1, S2 and S4. Please note that, in FIG. 6, the outputted path control signal by each DFF is fed into its following DFF as an input signal, for example, the path control signal S1 outputted by DFF 1211 is transmitted to an input terminal of the following DFF 1212. Similarly, the path control signal S2 outputted by DFF 1212 is transmitted to the DFF 1213, the path control signal S3 outputted by DFF 1213 is transmitted to the DFF 1214, and the path control signal S4B outputted by DFF 1214 is transmitted back to the DFF 1211 for toggling. The XOR gate 1221 receives the path control signal S1 and the path control signal S3, and generates the output control signal ZI accordingly; likewise, the XOR gate 1222 receives the path control signal S2 and the path control signal S4 and generates the output control signal ZQ accordingly, and then the inverters 1231 and 1232 generate the output signals ZIB and ZQB as, respectively, inverses of the output signal ZI and ZQ. The inverters are only for illustration of logic operations For example, the above operation of XOR gates and inverters could be implemented with a single XORB gate to avoid additional delay due to the signal inversion. Please note that the timing circuit 1200 shown in FIG. 6 is merely an exemplary embodiment of the present invention and the architecture of the timing circuit 1200 can be implemented differently according to various design requirements.

Figure 7:
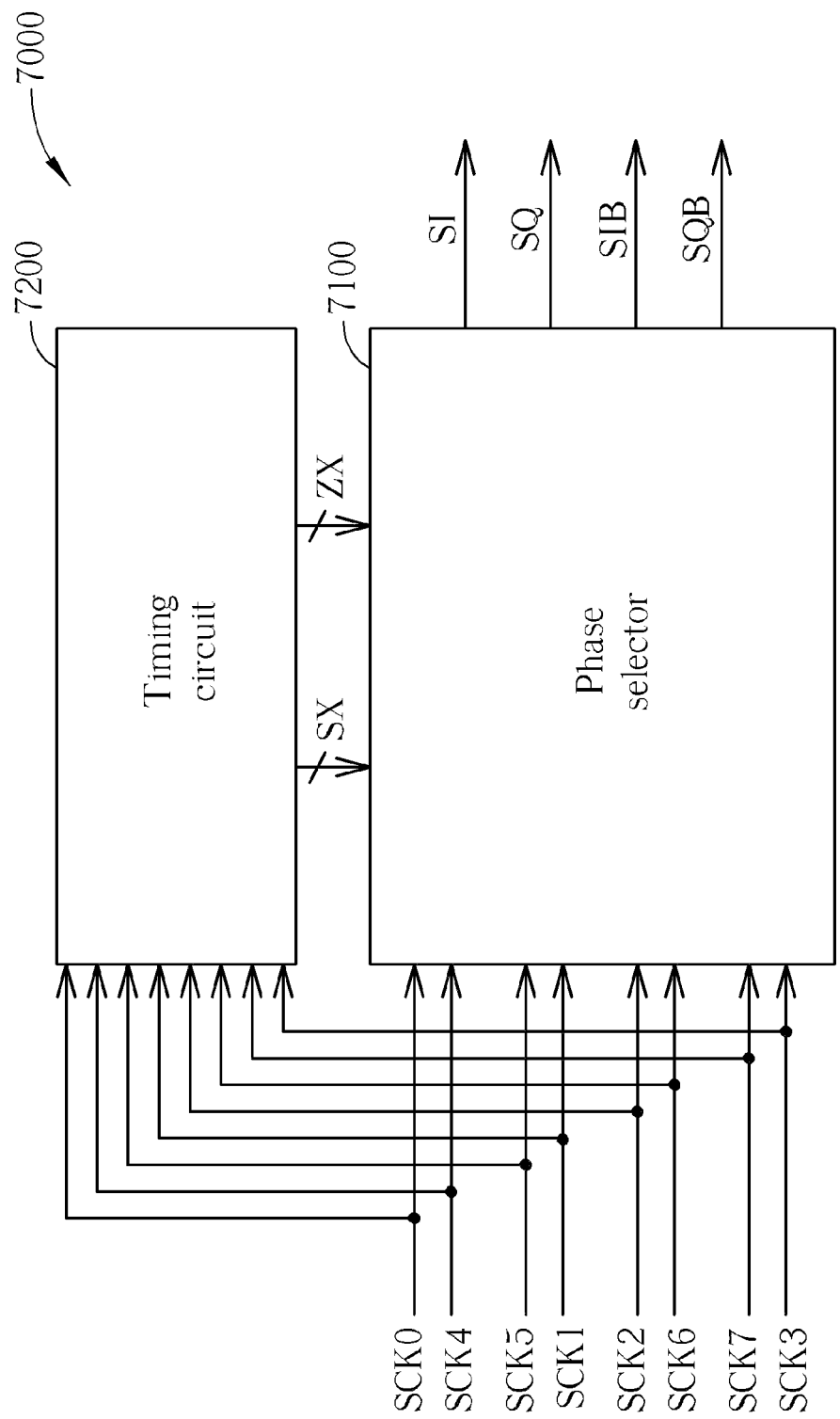
FIG. 7 is a frequency divider according to another embodiment of the present invention.

In addition, the control signals of the present invention are not limited to operational products of the output signals; in other embodiments of the present invention, the control signals can also be generated from the input signals. Please refer to FIG. 7, which is a frequency divider 7000 according to another embodiment of the present invention. The frequency divider 7000 includes (but is not limited to) a phase selector 7100 and a timing circuit 7200. The phase selector 7100 has a structure and functionality similar to the phase selector 1100, and therefore further details are omitted here. The timing circuit 7200, unlike the timing circuit 1200, utilizes the input signals SCK0~SCK7 to generate the control signals SX and ZX (in this example, SX is a plurality of path control signals, and ZX is a plurality of output control signals), and the phase selector 7100 selects from a predetermined reference voltage (e.g. a reference ground voltage) and multiple input signals SCK0~SCK7 of identical waveform but different phase; however, the generation of the control signals SX and ZX is based on identical concepts as the control signals shown in FIG. 1. For each single output signal, the corresponding path control signal toggles when the corresponding output control signal is indicative of the predetermined reference voltage, meaning a glitch-free output signal can be achieved.

Figure 8:
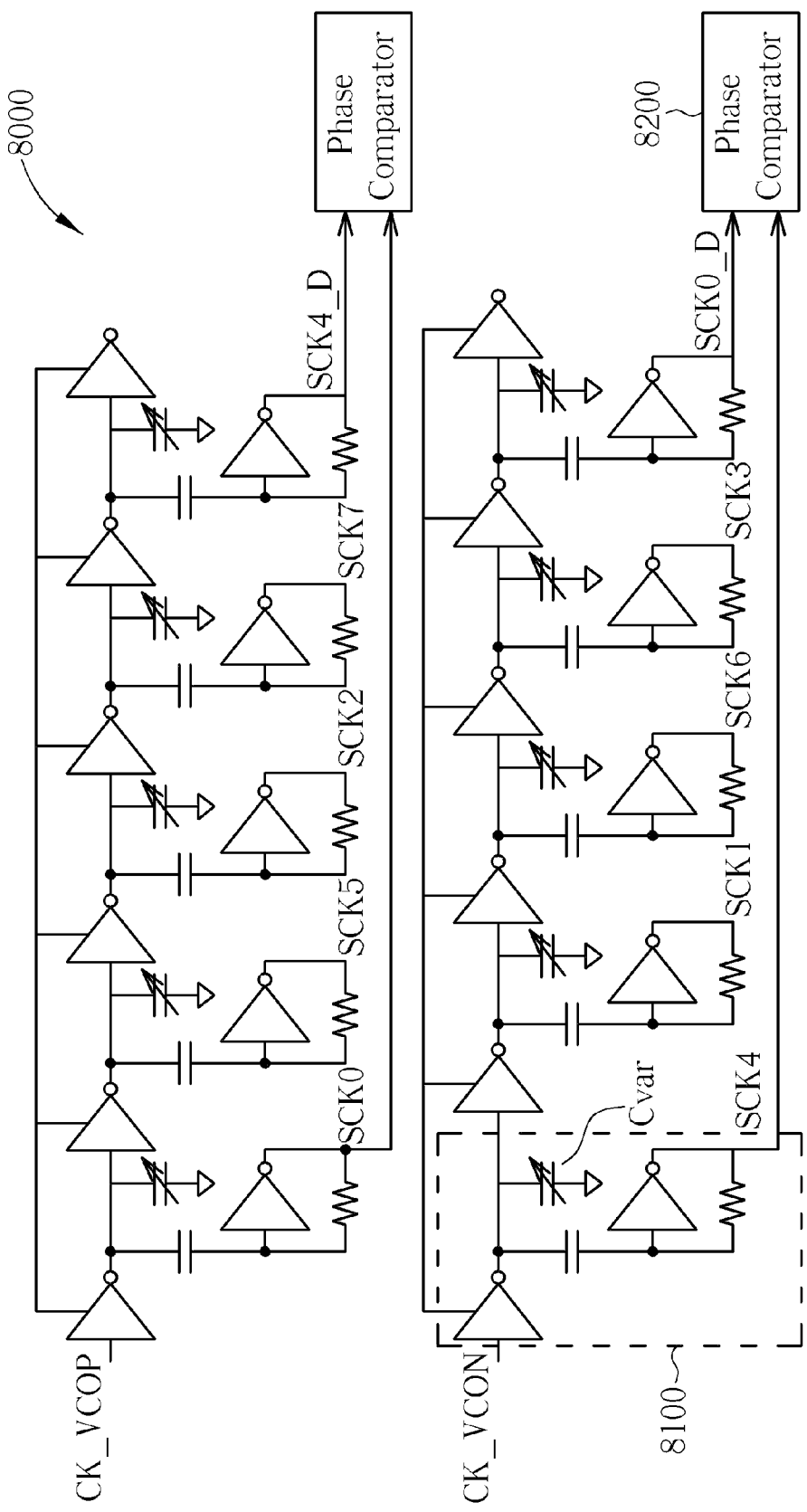
FIG. 8 is an exemplary diagram of a phase generator according to an embodiment of the present invention.

In another embodiment of the present invention, the frequency divider further includes a phase generator such that the frequency divider of the present invention can be utilized by being coupled directly to an oscillator. FIG. 8 is an exemplary diagram of a phase generator 8000 according to an embodiment of the present invention. The phase generator 8000 is implemented as a voltage controlled delay line (VCDL), and includes a plurality of delay cells and two phase comparators. If a voltage controlled oscillator (VCO) is utilized to output a pair of complementary oscillation signals CK_VCOP and CK_VCON, the phase generator 8000 will receive the oscillation signals CK_VCOP and CK_VCON to output the input signals SCK0-SCK7 which are arranged orderly in phase domain accordingly; for example, the oscillation signal CK_VCON will be fed into a delay cell 8100 and the delay cell 8100 will thereby output the input SCK4 and deliver an delayed signal into a following delay cell, please note that, a delay time of the delay cell 8100 can be controlled by manipulating a corresponding variable capacitor Cvar within the delay cell 8100; similarly, the input signals SCK1, SCK6, SCK3 and SCK0_D are generated by following delay cells, and the input signals SCK4, and SCK0_D are fed to a phase comparator 8200 such that the phase comparator 8200 can control the variable capacitors in the delay cells accordingly. In this way, the frequency divider of the present invention can be directly integrated with an oscillator without difficulty.

To summarize, the aforementioned embodiments provide frequency dividers capable of high-speed operation. With the help of control signals generated based on output signals or input signals, the frequency divider of the present invention can perform phase selection from the input signals of different phases and a reference voltage. In addition, since the phase switching operation occurs when an output signal is substantially fixed as the reference voltage, jitter noise resulting from switching can be ignored and a glitch-free output signal can be easily achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency divider, comprising:
a phase selector, arranged to receive a plurality of input signals and a plurality of control signals and output a plurality of output signals according to the control signals, wherein a predetermined reference voltage and the input signals are selectively chosen to generate the output signals according to the control signals, and the input signals are of a same frequency but different phases; and
a timing circuit, coupled to the phase selector, arranged to receive the output signals and generate the control signals according to the output signals.

2. The frequency divider of claim 1, wherein the input signals comprise at least three input signals.

3. The frequency divider of claim 1, wherein each of the output signals has a waveform partially generated from the input signals and partially generated from the predetermined reference voltage.

4. The frequency divider of claim 1, wherein the phase selector comprises a plurality of preliminary selecting circuits, the control signals comprise a plurality of path control signals and a plurality of output control signals, and each of the preliminary selecting circuits is arranged to choose a preliminary signal from the input signals according to a specific path control signal of the path control signals, and is arranged to choose one of the chosen preliminary signal and the predetermined reference voltage as a specific output signal of the output signals according to a specific output control signal of the output control signals.

5. The frequency divider of claim 4, wherein the specific output control signal has a period identical to a period of the specific output signal, and the specific output control signal controls the preliminary selecting circuit to output the predetermined reference voltage as the specific output signal when a voltage level of the preliminary signal is substantially identical to the predetermined reference voltage.

6. The frequency divider of claim 4, wherein the specific path control signal toggles when the predetermined reference voltage is outputted by the preliminary selecting circuit according to the specific output control signal.

7. The frequency divider of claim 4, wherein the specific path control signal has a period which is twice a period of the specific output signal.

8. The frequency divider of claim 4, wherein the path control signals comprise at least a first path control signal, a second path control signal, a third path control signal, and a fourth path control signal; the output control signals comprises at least a first output control signal and a second output control signal; the output signals comprise four quadrature signals generated from the preliminary selecting circuits, respectively; the quadrature signals comprise a first output signal, a second output signal, a third output signal and a fourth output signal; and
the timing circuit comprises:
- a first D flip-flop (DFF), arranged to receive the first output signal as a clock signal and a toggle control signal as an input signal, and generate the first path control signal;
- a second DFF, arranged to receive the second output signal as a clock signal and the first path control signal as an input signal, and generate the second path control signal;
- a third DFF, arranged to receive the third output signal as a clock signal and the second path control signal as an input signal, and generate the third path control signal;
- a fourth DFF, arranged to receive the fourth output signal as a clock signal and the third path control signal as an input signal, and generate the fourth path control signal, wherein the toggle control signal is an inverse version of the fourth path control signal;
- a first XOR circuit, coupled to the first DFF and the third DFF, arranged to received the first path control signal and the third path control signal to generate the first output control signal; and
- a second XOR circuit, coupled to the second DFF and the fourth DFF, arranged to received the second path control signal and the fourth path control signal to generate the second output control signal.

9. The frequency divider of claim 1, further comprises:
a phase generator, arranged to receive at least one oscillation signal and output the input signals which are arranged orderly in phase domain according to the at least one oscillation signal;
wherein a number of the input signals is larger than a number of the at least one oscillation signal.

10. A frequency divider, comprising:
a phase selector, arranged to receive a plurality of input signals and a plurality of control signals and output a plurality of output signals according to the control signals, wherein a predetermined reference voltage and the input signals are selectively chosen to generate the output signals according to the control signals, and the input signals are of a same frequency but different phases; and
a timing circuit, coupled to the phase selector, arranged to receive the input signals and generate the control signals according to the input signals.

11. The frequency divider of claim 10, wherein the input signals comprise at least three input signals.

12. The frequency divider of claim 10, wherein each of the output signals has a waveform partially generated from the input signals and partially generated from the predetermined reference voltage.

13. The frequency divider of claim 10, wherein the phase selector comprises a plurality of preliminary selecting circuits, the control signals comprise a plurality of path control signals and a plurality of output control signals, and each of the preliminary selecting circuits is arranged to choose a preliminary signal from the input signals according to a specific path control signal of the path control signals, and is arranged to choose one of the chosen preliminary signal and the predetermined reference voltage as a specific output signal of the output signals according to a specific output control signal of the output control signals.

14. The frequency divider of claim 13, wherein the specific output control signal has a period identical to a period of the specific output signal, and the specific output control signal controls the preliminary selecting circuit to output the predetermined reference voltage as the specific output signal when a voltage level of the preliminary signal is substantially identical to the predetermined reference voltage.

15. The frequency divider of claim 13, wherein the specific path control signal toggles when the predetermined reference voltage is outputted by the preliminary selecting circuit according to the specific output control signal.

16. The frequency divider of claim 10, further comprises:
a phase generator, arranged to receive at least one oscillation signal and output the input signals which are arranged orderly in phase domain according to the at least one oscillation signal;
wherein a number of the input signals is larger than a number of the at least one oscillation signal.

* * * * *